US 11,804,714 B2

(12) United States Patent
Abu-Rejailah et al.

(10) Patent No.: US 11,804,714 B2
(45) Date of Patent: Oct. 31, 2023

(54) INTELLIGENT SYSTEM FOR CONTROLLING AND MONITORING THE BALANCE CONDITION, HARMONIC, AND LEAKAGE CURRENT IN INDUSTRIAL AND RESIDENTIAL AREAS

(71) Applicant: SAUDI ARABIAN OIL COMPANY, Dhahran (SA)

(72) Inventors: Adel F. Abu-Rejailah, Dammam (SA); Anas A. AlHamad, Abqaiq (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 45 days.

(21) Appl. No.: 17/487,560

(22) Filed: Sep. 28, 2021

(65) Prior Publication Data
US 2023/0095873 A1  Mar. 30, 2023

(51) Int. Cl.
  *H02J 3/26* (2006.01)
  *H02J 3/14* (2006.01)
  *G01R 31/52* (2020.01)
  *H02J 3/01* (2006.01)

(52) U.S. Cl.
  CPC .......... *H02J 3/26* (2013.01); *H02J 3/14* (2013.01); *G01R 31/52* (2020.01); *H02J 3/01* (2013.01)

(58) Field of Classification Search
  CPC ...... G01R 31/50–74; H02J 3/001–0012; H02J 3/01; H02J 3/14; H02J 3/26
  See application file for complete search history.

(56) References Cited

U.S. PATENT DOCUMENTS

| | | | |
|---|---|---|---|
| 5,977,660 A | 11/1999 | Mandalakas et al. | |
| 10,757,830 B1* | 8/2020 | Errato, Jr. | .......... H05K 7/20545 |
| 2003/0105608 A1* | 6/2003 | Hart | ..................... H02H 1/0061 |
| | | | 702/122 |

(Continued)

FOREIGN PATENT DOCUMENTS

| | | |
|---|---|---|
| CN | 201956698 U | 8/2011 |
| CN | 105356488 A | 2/2016 |

(Continued)

OTHER PUBLICATIONS

English machine translation of CN105978004A published Sep. 28, 2016. (Year: 2016).*

(Continued)

*Primary Examiner* — Rexford N Barnie
*Assistant Examiner* — David A Shiao
(74) *Attorney, Agent, or Firm* — Osha Bergman Watanabe & Burton LLP (57) ABSTRACT

A system for controlling and monitoring electrical energy loads includes a current transducer configured to monitor values of electrical current in the system, wherein neutral and ground lines are monitored via separate current transducers. Additionally, the system includes a centralized programmable logic controller (PLC) configured to receive measured values from the current transducer in real time and a local PLC configured to receive the measured values from the centralized PLC. Further, the local PLC periodically compares the measured values of the electrical energy with predetermined thresholds and automatically redistributes the electrical energy to electrical energy loads among three phases based on the comparison.

19 Claims, 11 Drawing Sheets

(56) References Cited

U.S. PATENT DOCUMENTS

| | | | | |
|---|---|---|---|---|
| 2010/0315092 A1* | 12/2010 | Nacson | .................. | G01R 31/52 |
| | | | | 324/510 |
| 2012/0316691 A1* | 12/2012 | Boardman | ................ | G05F 1/66 |
| | | | | 700/292 |
| 2014/0159483 A1* | 6/2014 | Robertazzi | ................ | H02J 3/26 |
| | | | | 307/14 |
| 2015/0200604 A1* | 7/2015 | Turner | ...................... | H02J 3/01 |
| | | | | 363/89 |
| 2015/0346262 A1* | 12/2015 | Curtis | ................... | H02H 5/105 |
| | | | | 324/509 |
| 2016/0064932 A1 | 3/2016 | Fischer et al. | | |
| 2019/0079129 A1 | 3/2019 | Valdes | | |
| 2019/0302175 A1* | 10/2019 | Nakash | .................. | G01R 27/18 |
| 2021/0102985 A1* | 4/2021 | Hao | ....................... | G01R 31/64 |

FOREIGN PATENT DOCUMENTS

| | | | |
|---|---|---|---|
| CN | 105958518 A | | 9/2016 |
| CN | 105978004 A | * | 9/2016 |
| CN | 106022973 A | * | 10/2016 |
| CN | 104852396 B | | 4/2017 |
| CN | 104852394 B | | 10/2018 |
| CN | 107591826 B | | 11/2019 |
| CN | 110690714 A | * | 1/2020 |
| CN | 112564137 A | | 3/2021 |
| EP | 2 533 390 B1 | | 11/2019 |
| WO | 2008/052042 A2 | | 5/2008 |

OTHER PUBLICATIONS

English machine translation of CN110690714A published Jan. 14, 2020. (Year: 2020).*

Doringin, Fanny et al., "Balance Automatic Control System Load 3 Phase"; International Journal of Computer Applications (0975-8887); vol. 177; No. 9; pp. 33-37; Oct. 2019 (5 pages).

Rashid, Abdulmuttalib T. et al., "Design and Implementation of Load Balancing System for a Smart Home"; Proceedings of the 3rd International Scientific Conference for Renewable Energy (ISCRE' 2018); Mar. 14-15, 2018 (6 pages).

Sutaya, I W et al., "The design of automatic three phases load balancing for dynamic electrical installation"; Journal of Physics: Conference Series; vol. 1810, Article 012002; pp. 1-8; Mar. 17, 2021 (9 pages).

Musyafa, Ali et al., "Leakage Current Test at Household Refrigerator Type Urg-129 Base Standard Nasional Indonesia (Sni) 04-6292.2.24-2001 for Safety Equipment"; Asian Journal of Natural & Applied Sciences; vol. 3, Issue 4; pp. 23-34; Dec. 2014 (12 pages).

Yan, Ye et al., "An Online Leakage Current Monitoring System of MOV used in Series Capacitor Compensation"; Proceedings of the 2018 International Conference on Power System Technology (POWERCON); pp. 3541-3546; Nov. 6-8, 2018 (6 pages).

Roy, Kaushik et al., "Leakage Current Mechanisms and Leakage Reduction Techniques in Deep-Submicrometer CMOS Curcuits"; Proceedings of the IEEE; vol. 91, Issue 2; pp. 305-327; Feb. 2003 (23 pages).

Mahdee, Mahir, "Investigation of Three-Phase Balancing Techniques: A Comparative Study of Different Solutions with Respect to Telecom Industry Needs"; Uppsala University: Master Programme in Renewable Electricity Production; pp. I-67; Oct. 2020 (77 pages).

International Search Report and Written Opinion of the International Searching Authority issued in corresponding International Application No. PCT/US2022/045085, dated Jan. 31, 2023 (14 pages).

International Electrotechnical Commission; "High-voltage direct current (HVDC) systems—Guidance to the specification and design evaluation of AC filters—Part 1: Overview"; IEC TR 62001-1, Edition 2.0; Jul. 13, 2021 (198 pages).

King, Debby, "Publications of the National Institute of Standards and Technology 1192 Catalog"; NIST Special Publication 305-Supplement 24; Mar. 1995 (392 pages).

* cited by examiner

FIG. 1

| # | Condition | E1, E2&E3 | $I_N$ | $I_G$ | Outcome |
|---|---|---|---|---|---|
| 1 | Balance System and free from Harmonic | Equal | $I_N = I_{Ph}$ | $I_G = 0$ | No Action will be Happened. |
| 2 | Not Balance System | Not Equal | $I_N \neq I_{Ph}$ | $I_G \neq 0$ | Re-Balancing Circuit will be Activated till the Issue Cleared. |
| 3 | The System has Harmonic | Not Equal | $35\% I_{Ph} \leq I_N \leq 102.7\% I_{Ph}$ | $I_G \neq 0$ | Re-Balancing Circuit will be Activated till the Issue Cleared. |
| 4 | Not Balance System & has Harmonic | Not Equal | $35\% I_{Ph} \leq I_N \leq 102.7\% I_{Ph}$ | $I_G \neq 0$ | C-Type Filter Circuit will be Activated till the Issue Cleared. |
| 5 | The System has Leakage Current | Not Equal | $I_N \neq I_{Ph}$ | $I_G \neq 0$ | The Leakage Current Circuit will be Activated till the Issue Cleared. |

FIG. 2

| | |
|---|---|
| Balance Condition Status: Un-Balanced<br>Re-Balance Circuit: Active<br>New Connection Phase: Ph2 (Yellow color)<br>Availability of Harmonic: No<br>C-Type Filter Circuit: Not Active<br>Leakage Current Value Detected : 1A<br>Technical Recommendation for Leakage Current: Not Applicable | |
| Re-Balance Circuit ▨  ▨ OFF<br>C-Type Filter Circuit ▨<br>Leakage Current ▨  ▨ ON<br>Detection | E1: 220 KWH<br>E2: 240 KWH<br>E3: 180 KWH<br>$I_{Ph} = 3\,A$<br>$I_N = 1\,A$<br>$I_G = 1\,A$<br>Leakage Current Location:<br>3 Meters from Power Panel |

FIG. 3

| PLC Output Status | | | Contacts Status for C Coil | | | | | Contacts Status for M Coil | | | | | Contacts Status for K Coil | | | | | 1= Closed 0= Open |
|---|---|---|---|---|---|---|---|---|---|---|---|---|---|---|---|---|---|---|
| O1 | O2 | O3 | C1 | C2 | C3 | C4 | C5 | M1 | M2 | M3 | M4 | M5 | K1 | K2 | K3 | K4 | K5 | Connected Phase |
| 0 | 0 | 0 | 1 | 1 | 0 | 1 | 0 | 0 | 1 | 0 | 1 | 0 | 0 | 1 | 0 | 1 | 0 | A |
| 0 | 1 | 1 | 0 | 0 | 1 | 0 | 1 | 1 | 0 | 1 | 0 | 1 | 0 | 1 | 0 | 1 | 0 | B |
| 1 | 0 | 1 | 0 | 0 | 1 | 0 | 1 | 0 | 1 | 0 | 1 | 0 | 1 | 0 | 1 | 0 | 1 | C |

Table 2: Status of Electrical Contacts for Balancing Load.

FIG. 4

| PLC Output | Contacts Status of Z Coil | | | 1= Closed  0= Open |
| --- | --- | --- | --- | --- |
| | Z1 | Z2 | Z3 | Harmonic Filter Status |
| O4 | | | | |
| 1 | 1 | 0 | 1 | ON |
| 0 | 0 | 1 | 0 | OFF |

Table 3: Status of Electrical Contacts for Activating the Harmonic Filter.

| Level 1 | | Level 2 | | Level 3 | | Level 4 | |
|---|---|---|---|---|---|---|---|
| $0\% < L_s \le 25\%$ of $E_{ave}$ | % | $25\% < L_s \le 50\%$ of $E_{ave}$ | % | $50\% < L_s \le 75\%$ of $E_{ave}$ | % | $75\% < L_s \le 100\%$ of $E_{ave}$ | % |
| 1 | 5.55 | 5 | 27.77 | 10 | 55.55 | | |
| 2 | 11.11 | 6 | 33.33 | | | | |
| 3 | 16.66 | 7 | 38.88 | | | | |
| 4 | 22.22 | 8 | 44.44 | | | | |
| | | 9 | 50 | | | | |

Table 4: Load Categories Criteria.

FIG. 9

| Load | Current Value | Ph #A | Ph #B | Ph #C |
|---|---|---|---|---|
| L1 | 5A | 10 | 9 | 1 |
| L2 | 10A | 8 | 7 | 3 |
| L3 | 3A | | 2 | 4 |
| L4 | 4A | | | 5 |
| L5 | 2A | | | 6 |
| L6 | 6 | | | |
| L7 | 7 | | | |
| L8 | 9 | | | |
| L9 | 1 | | | |
| L10 | 8A | | | |
| Total | 55A | 18 | 18 | 19 |
| $E_{ave}$ | 55/3=18 | | | |

Table 4: Load Distribution Criteria.

INTELLIGENT SYSTEM FOR CONTROLLING AND MONITORING THE BALANCE CONDITION, HARMONIC, AND LEAKAGE CURRENT IN INDUSTRIAL AND RESIDENTIAL AREAS

BACKGROUND

The disclosure aims to measure, analyze, and control the load across a multi-phase system to ensure well-balanced phases, eliminate system harmonics, and report any current leakage. The main benefits of this disclosure are reducing overall power consumption, improving safety, minimizing power cost, and maintaining equipment longevity. This disclosure utilizes a centralized system where live data are gathered for further analysis. The system utilizes a current and energy transducer installed at each of the incoming three phases to observe energy and current readings. Additionally, neutral and ground lines are also observed via a separate current transducer and gathered data are shared with the system Programmable Logic Controller (PLC).

The centralized system, PLC, tests for any unbalanced load, harmonics, and leakage current in light of all the gathered data. Corrective actions will be made to transfer unbalanced loads between phases and ensure maximum compatibility. Furthermore, the system will activate harmonics filters once harmonics are detected. This action is carried using C-type filters where a capacitor is placed in series with a combination of a resistor connected in parallel to a capacitor and inductor. In order to observe any leakage current, Kirchhoff's Current Law (KCL) is utilized as the supplied current must remain the same throughout each circuit. The system will alarm the user for any leakage and indicate a possible leakage location.

SUMMARY

In general, in one aspect, the invention relates to a system. The system comprises a current transducer configured to monitor values of electrical current in the system, wherein neutral and ground lines are monitored via separate current transducers, a centralized programmable logic controller (PLC) configured to receive measured values from the current transducer in real time, and a local PLC configured to receive the measured values from the centralized PLC, wherein the local PLC periodically compares the measured values of the electrical energy with predetermined thresholds and automatically redistributes the electrical energy to electrical energy loads among three phases based on the comparison.

In general, in one aspect, the invention relates to a method. The method comprising monitoring values of electrical current in the system, wherein neutral and ground lines are monitored via separate current transducers, receiving measured values form the current transducer in real time, and receiving the measured values form the centralized PLC, wherein the local PLC periodically compares the measured values of the electrical energy with predetermined thresholds and automatically redistributes the electrical energy to the electrical energy loads among three phases based on the comparison.

BRIEF DESCRIPTION OF DRAWINGS

Specific embodiments disclosed herein will now be described in detail with reference to the accompanying figures. Like elements in the various figures are denoted by like reference numerals for consistency. Like elements may not be labeled in all figures for the sake of simplicity.

DETAILED DESCRIPTION

In the following detailed description of embodiments disclosed herein, numerous specific details are set forth in order to provide a more thorough understanding disclosed herein. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-11, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed herein provide a method and a system for controlling and monitoring electrical energy loads. The benefits of this disclosure are optimizing the multi-phase system (100) by reducing electrical power consumption and cost, and utilizing the equipment more efficiently. The multi-phase system (100) monitors all phases (101-103), as well as neutral (141) and ground lines (142) and analyses electrical energy and current readings. The gathered data is analyzed by a local programmable logic controller (PLC) (121-124) and a central PLC (130). The PLCs test the electrical current for unbalanced load, harmonics and leakage current. In one or more embodiments, in case the system detects any defects, corrective actions may be made to transfer unbalanced loads between phases and ensure maximum compatibility, activate harmonics filters once harmonics are detected, and KCL may be utilized as the supplied current must remain the same throughout each circuit. Further, the multi-phase system (100) may alarm the user for any leakage and indicate a possible leakage location on a central LCD (150).

Figure 1:
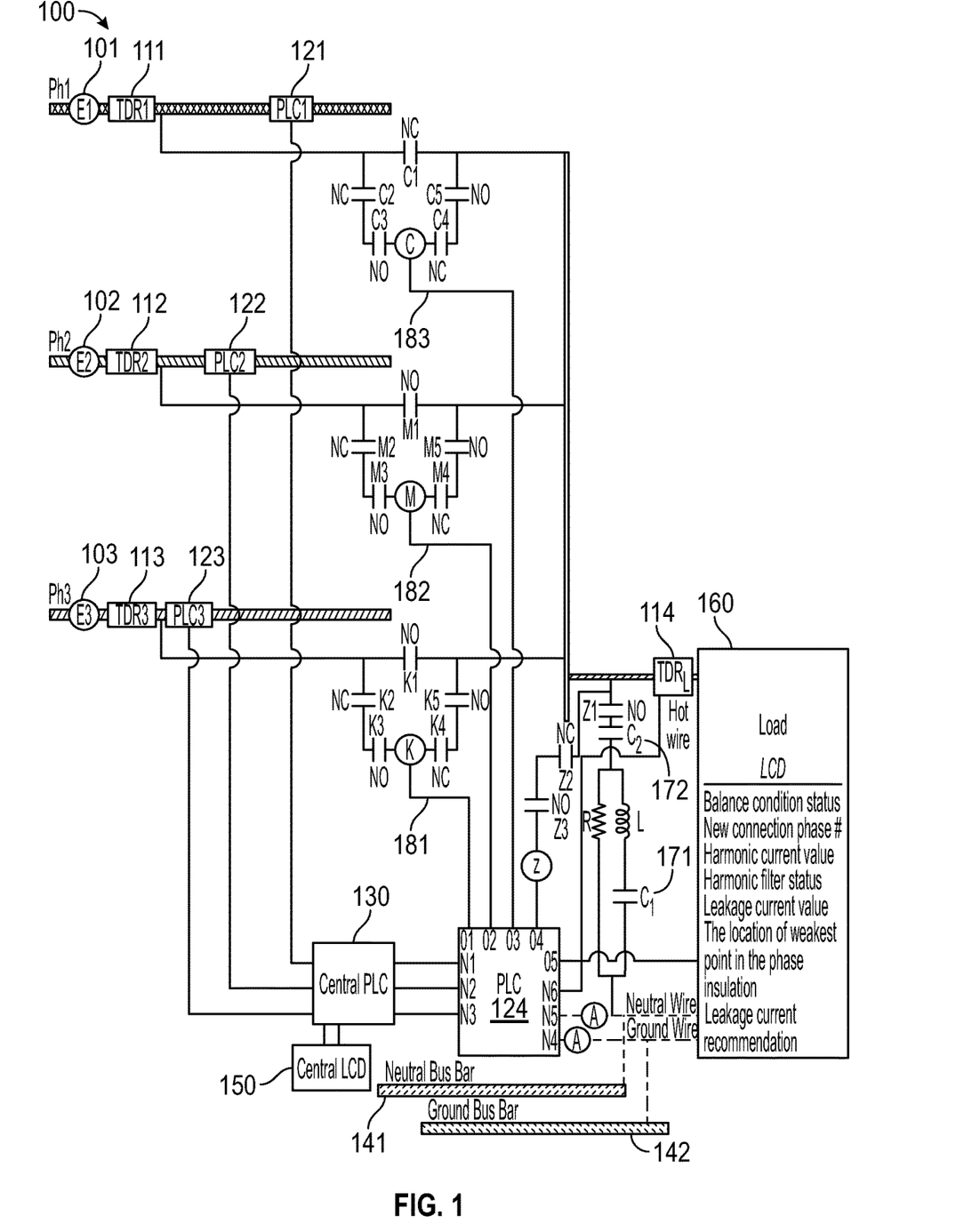
FIG. 1 shows a system in accordance with one or more embodiments.

FIG. 1 shows a schematic diagram illustrating a system for controlling and monitoring electrical energy loads (100) including the local PLCs (121-124) connected to the central PLC (130). The local PLCs are connected to time-domain reflectometers (TDR) (111-114). TDR (111-114) detects the location of faults in transmission lines. The location of faults is detected by sending a low voltage signal through the transmission line and checks for reflection due to the mismatch in the impedance of the phase line between a local switch (AC switch, light switch, outlet) and the panel board or the load itself. When the TDRs (111-113) do not register reflections, there is no impedance mismatch. However, when a part of the low voltage signal is reflected to the TDRs (111-113), the TDRs may measure time and propagation velocity of the received low voltage signal and calculate the location and the nature of the fault.

Further, the local PLCs (121-124) receive values of the electrical energy by the central PLC (130) and compare received electrical energy values to the setting parameters. Based on the comparison shown in FIG. 2. the local PLCs (121-124) will perform automatic redistribution of the loads among three phases based on received kWh values until the electrical energy (kWh) is equal in three phases (101-103). In one or more embodiments there are at least five possible cases where redistribution of electrical energy is considered. The circuit of harmonic filter and leakage current circuit will be activated based on received current values in neutral and ground lines.

Figure 2:
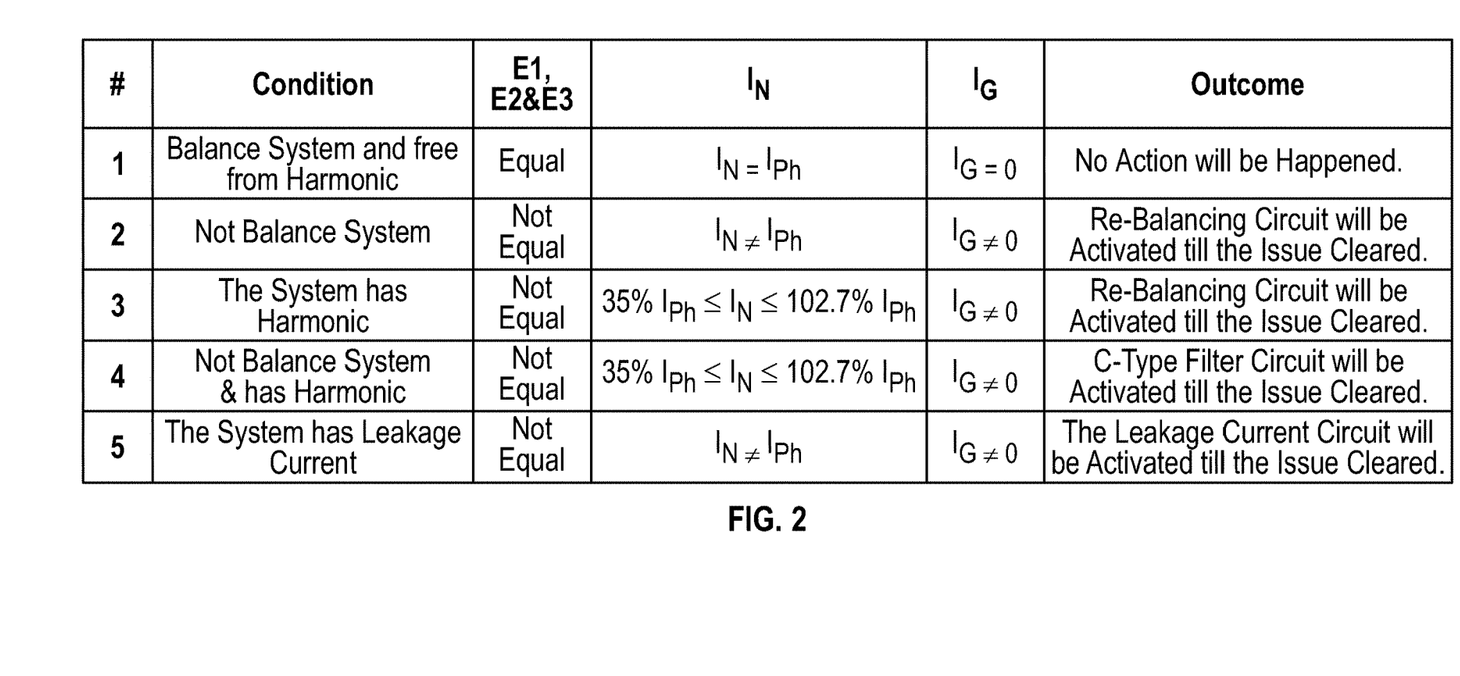
FIG. 2 shows a table for determining action taken by the system.

Specifically, as shown in FIG. 2, when the system is in balance and free from harmonics, the electrical energy is equal in all phases, electrical current value in neutral line is equal to electrical current value of all phases, and when electrical current value in ground line is equal to zero, the system does not perform any action. When the system is in not balance or has harmonics, the electrical energy is not equal in all phases, electrical current value in neutral line is not equal to electrical current value of all phases or when electrical current value in neutral line is greater or equal to 35% of the electrical current value of all phases or smaller or equal to 102.7% of the electrical current value of all phases, and when electrical current value in ground line is not equal to zero, the rebalancing circuit is activated until the balance is established. When the system is both, not in balance and has harmonics, the electrical energy is not equal in all phases, electrical current value in neutral line is greater or equal to 35% of the electrical current value of all phases or smaller or equal to 102.7% of the electrical current value of all phases, and when electrical current value in ground line is not equal to zero, the C-type filter circuit is activated until the issue is cleared. Finally, when the system has leakage current, the electrical energy is not equal in all phases, electrical current value in neutral line is not equal to electrical current value of all phases, and when electrical current value in ground line is not equal to zero, the leakage current circuit is activated until the issue is cleared.

Figure 3:
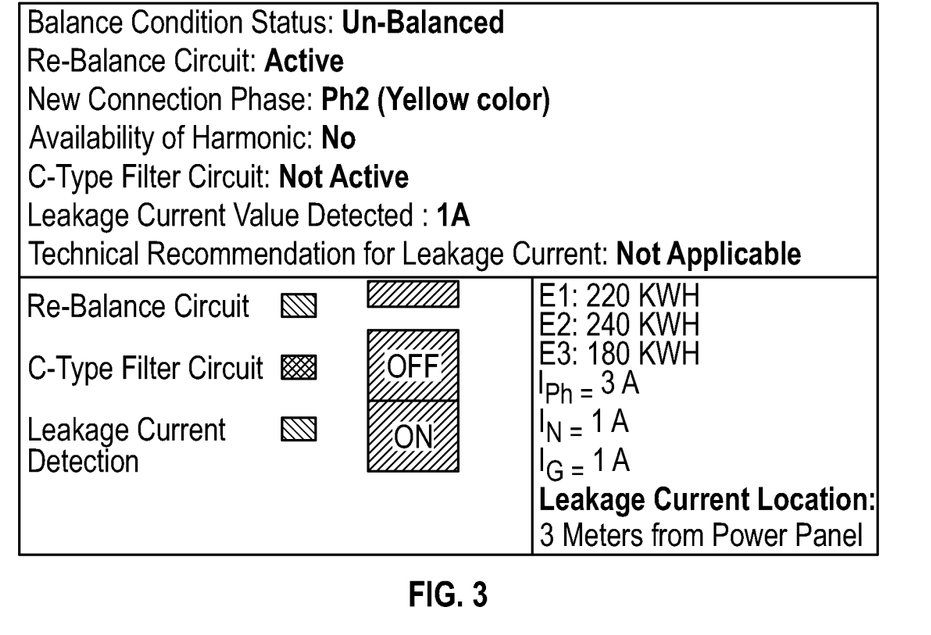
FIG. 3 shows the user interface

As shown in FIG. 3, the local PLCs (121-124) are connected to a smart touch display (160) that is used to indicate the system key values such as harmonics value and status, balancing activities and condition, and leakage current value and location. The smart touch display (160) may be a liquid crystal display (LCD), a plasma display, touchscreen, LED, cathode ray tube (CRT) monitor, projector, or other display device. Further, presenting data on the smart touch display (160) may be accomplished through various presenting methods. Specifically, data may be presented through a user interface provided by the smart touch display (160). As shown in FIG. 3. the user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, for example, data presented as actual data values through text, or rendered by the computing device into a visual representation of the data, such as through visualizing a data model.

For example, a GUI may first obtain a notification from the central PLC (130) requesting that a particular data object be presented within the GUI. Next, the GUI may determine a data object type associated with the particular data object, for example, by obtaining data from a data attribute within the data object that identifies the data object type. Then, the GUI may determine any rules designated for displaying that data object type, for example, rules specified by a software framework for a data object class or according to any local parameters defined by the GUI for presenting that data object type. Finally, the GUI may obtain data values from the particular data object and render a visual representation of the data values within a display device according to the designated rules for that data object type.

Figure 4:
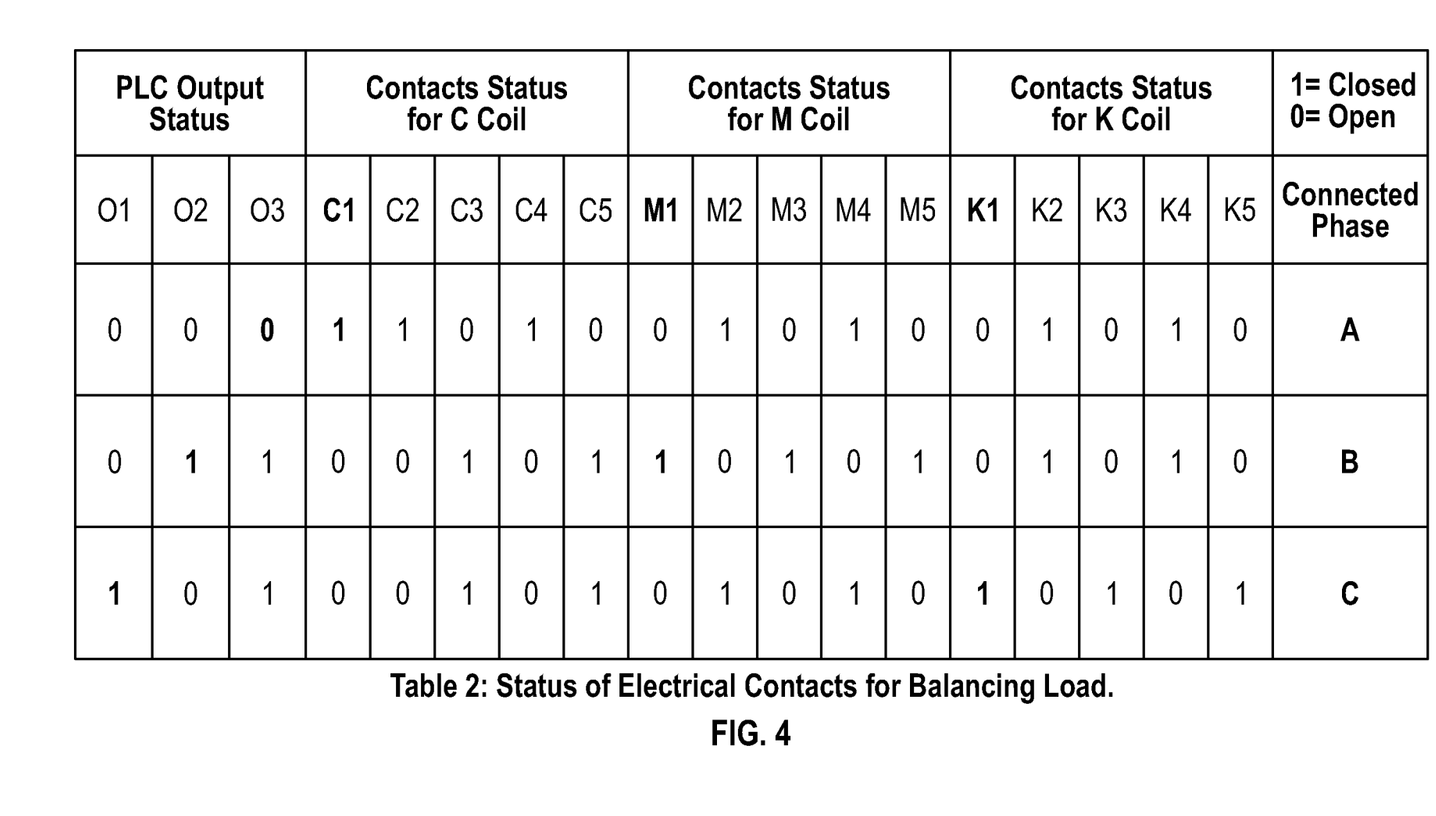
FIG. 4 shows a table for methodology of transferring a load between phases

Turning to FIG. 4, which shows a table that addresses the system methodology of transferring a particular load between the three power phases (Ph1=A, Ph2=B, and Ph3=C). In its default status, the load is set at Ph1 with a set of contacts (C1, C2, C3, C4, and C5) configured to have the load energized with no signal needed from the PLC (O1, O2, and O3). Once the system completes the phase comparison and decides to transfer this particular load to another phase for balancing purposes, depending on the chosen phase, the PLC sends a signal to energize associated coil for the chosen phase (coil M for Ph2, coil K for Ph3). The values of the PLC output (O1, O2, and O3), the contacts of coil C (C1, C2, C3, C4, and C5), the contacts of coil M (M1, M2, M3, M4, and M5), and the contact of coil K (K1, K2, K3, K4, and K5) are set based on the chosen phase.

Further, C-Type harmonic filter (171) is connected to a local PLC (124) output to remove the harmonics from the system. It consists of a capacitor placed in series with a combination of a resistor connected in parallel to a capacitor and inductor. The harmonic filter has three electrical contacts between PLC and the hot line. The C-type filter (171) works by providing low impedance path to the harmonic currents tuned at harmonic frequency and above. This harmonic current is filtered out by the C-type filter (171) and flows to the ground. C-type filter (171) may be used to reduce harmonic distortion, improve system performance, and compensate for reactive power. The C-type filter has performance advantages at higher frequencies and has no losses at the base frequency.

Figure 5:
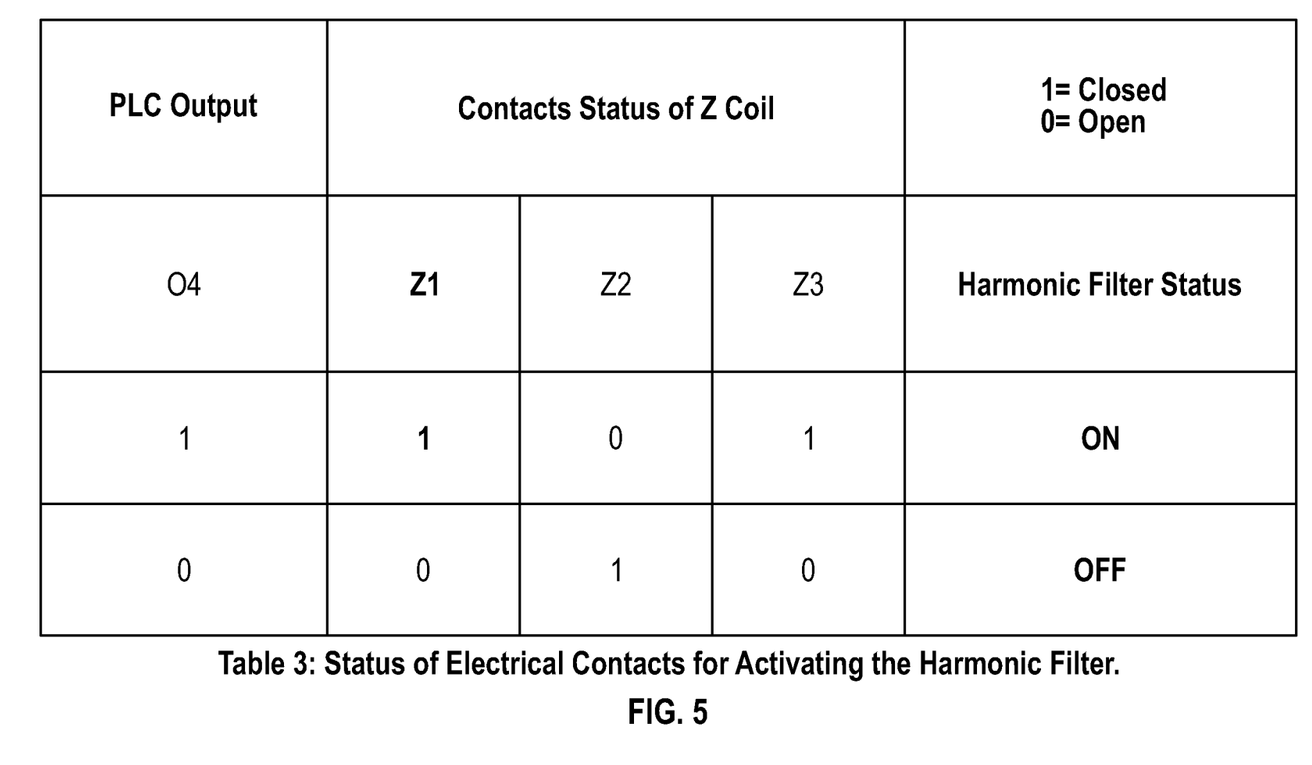
FIG. 5 shows a table for controlling the activation of C-type filter

FIG. 5 shows the controls of the activation of the C-type filter. Specifically, once harmonics are detected, the PLC will send a signal using O4 (O4=1) to energize Z Coil and hence activate the C-type filter (Z1=1, Z2=0, and Z3=1). In its normal state, the C-type filter is set on deactivation mode and only activated once needed. Additionally, C-type filter contains two capacitors (C1 & C2) and they are both part of its circuitry as indicated under (171) and (172).

Continuing with FIG. 1. the central PLC (130) receives the values of electrical energy by three separated transducers (111-113), each phase being connected to a single transducer. Further, the central PLC (130) saves the data which comes from the transducers (111-113) current transducers and sending those data to the local PLCs (121-124). Central Programmable logic control (PLC) receives the values of electrical energy by phase Programmable Logic Control (PLC).

Figure 6:
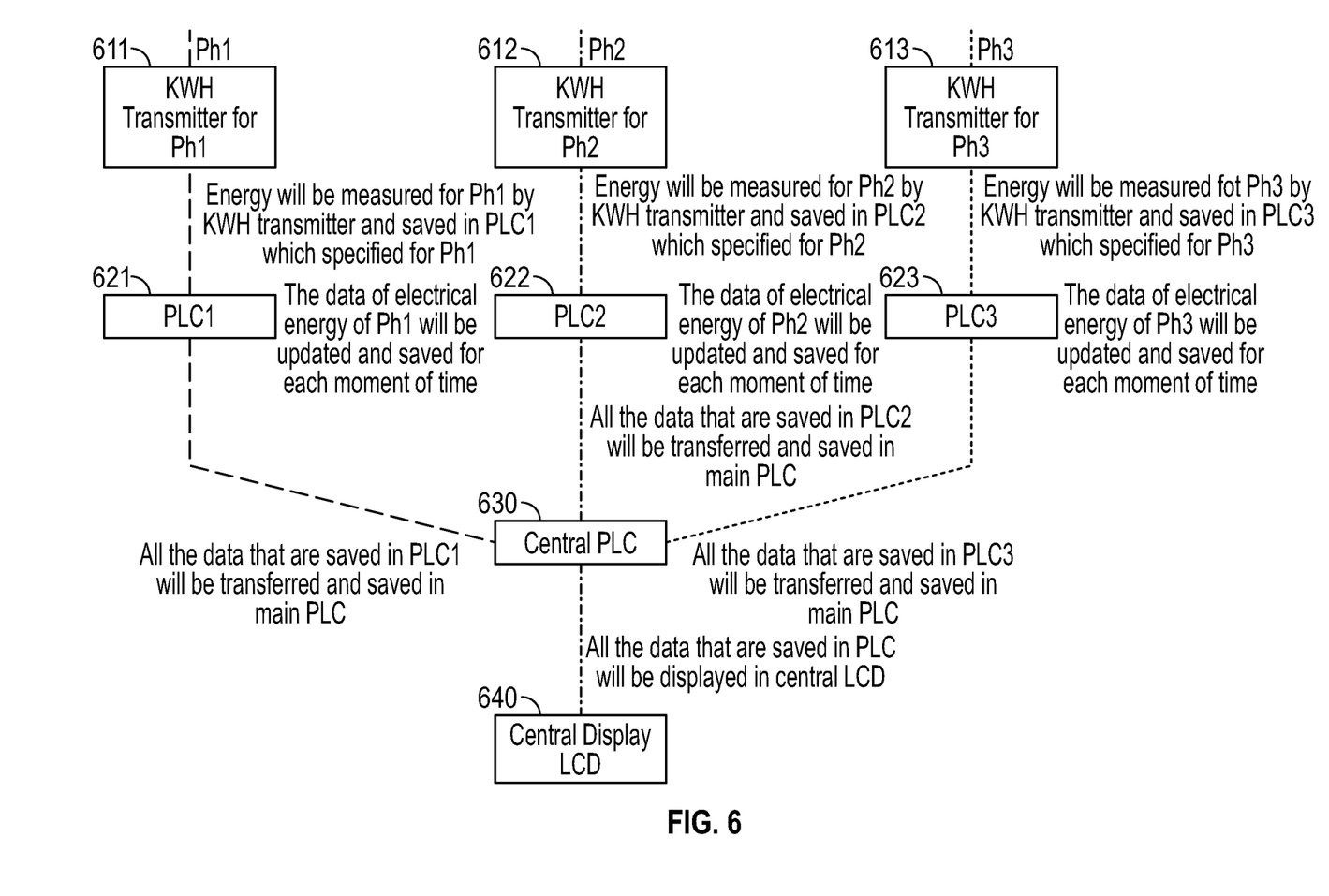
FIG. 6 shows a flowchart of communication between different elements within the central unit.

Further, the central PLC (130) and local PLCs (121-124) have bidirectional workflow. FIG. 6 shows an initial process where the data is obtained and analyzed. Specifically, in Blocks 611-613, the electrical energy is measured for each phase (101-103) by the TDRs (111-113). TDRs (111-113) measure the impedance between the local switch and the load itself. In blocks 621-623, the data obtained by the TDRs (111-113) is stored to the local PLCs (121-124) assigned to each phase. This process operates in the real-time and the data about electrical energy of each phase is continuously updated and saved to the local PLCs (121-124).

Continuing with the block 640, data obtained by the TDRs (111-113) and stored to the local PLCs (121-124) is continuously transferred to the central PLC (130). The central PLC (130) processes and analyses the data and sends the results of the analysis to the smart touch display (160) that interacts with the user in Block 640.

Figure 7:
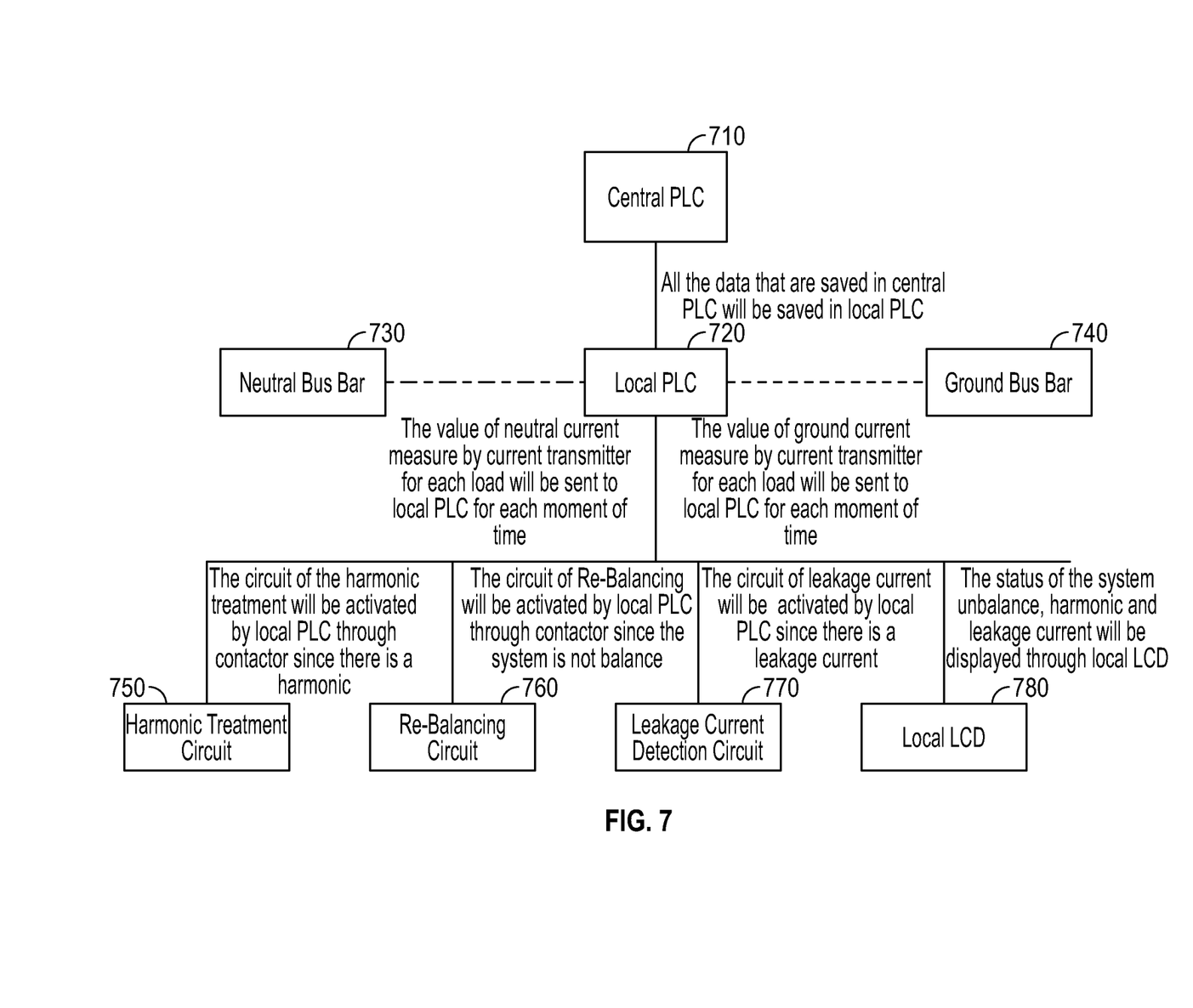
FIG. 7 shows a flowchart of communication between different elements within the central unit.

Switching to FIG. 7. where in Block 710 data is already saved to the central PLC (130) and presented to the user. The user may interact with the system by providing controls, tuning the parameters, and the desired results. In Block 720, the users requests and changes are transmitted to the local PLCs (121-124) which contain real-time data regarding the data about the electric energy in the each phase. Further, in Blocks 730 and 740, the local PLCs (121) receive the value of neutral and ground electrical currents that are measured by the current transmitter for each load. Measuring data about the electrical current values of neutral (141) and ground bus bars (142) is obtained and transmitted to the local PLCs in the real-time.

The local PLCs (121-124) contain four modules for modifying and observing the system. Block 750, observes the system for potential harmonics. The harmonics are created by electronic equipment with nonlinear loads drawing in current in abrupt short pulses. The short pulses cause distorted current waveforms, which in turn cause harmonic currents to flow back into other parts of the power system. Upon detecting the harmonics, the harmonics treatment circuit is activated by the local PLC. Further, the circuit of harmonic filter is be activated based on received current values in neutral and ground lines.

Block 760, observes the system for potential disbalances in each phase. Upon detecting the disbalances in a phase, the rebalancing circuit is activated by the local PLC. Additionally, when the disbalances are not reported to the local PLC the process of redistributing the load may be performed periodically to ensure the optimal function of the system. When a new load is connected to the system, the system will assign a load to a random phase and after a period of time start the process of rebalancing. The system starts the process of rebalancing after a period of time to ensure that a new load is not a temporary load. Further, the circuit of harmonic filter is be activated based on received current values in neutral and ground lines.

Block 770, observes the system for potential leakage currents. Leakage current is the electrical current that flows through the protective ground conductor to ground. In the absence of a grounding connection, it is the electrical current that could flow from any conductive part or the surface of non-conductive parts to ground if a conductive path was available. Upon detecting the leakage, the leakage circuit is activated by the local PLC. In order to observe any leakage current, Kirchhoff's Current Law (KCL) is utilized as the supplied current must remain the same throughout each circuit. The system will alarm the user for any leakage and indicate a possible leakage location Block 780, displays a status of rebalancing, harmonic and leakage current circuits processes. The status is displayed on smart touch display. The user may interact with the smart touch display and provide system with new and tuned parameters.

Figure 8:
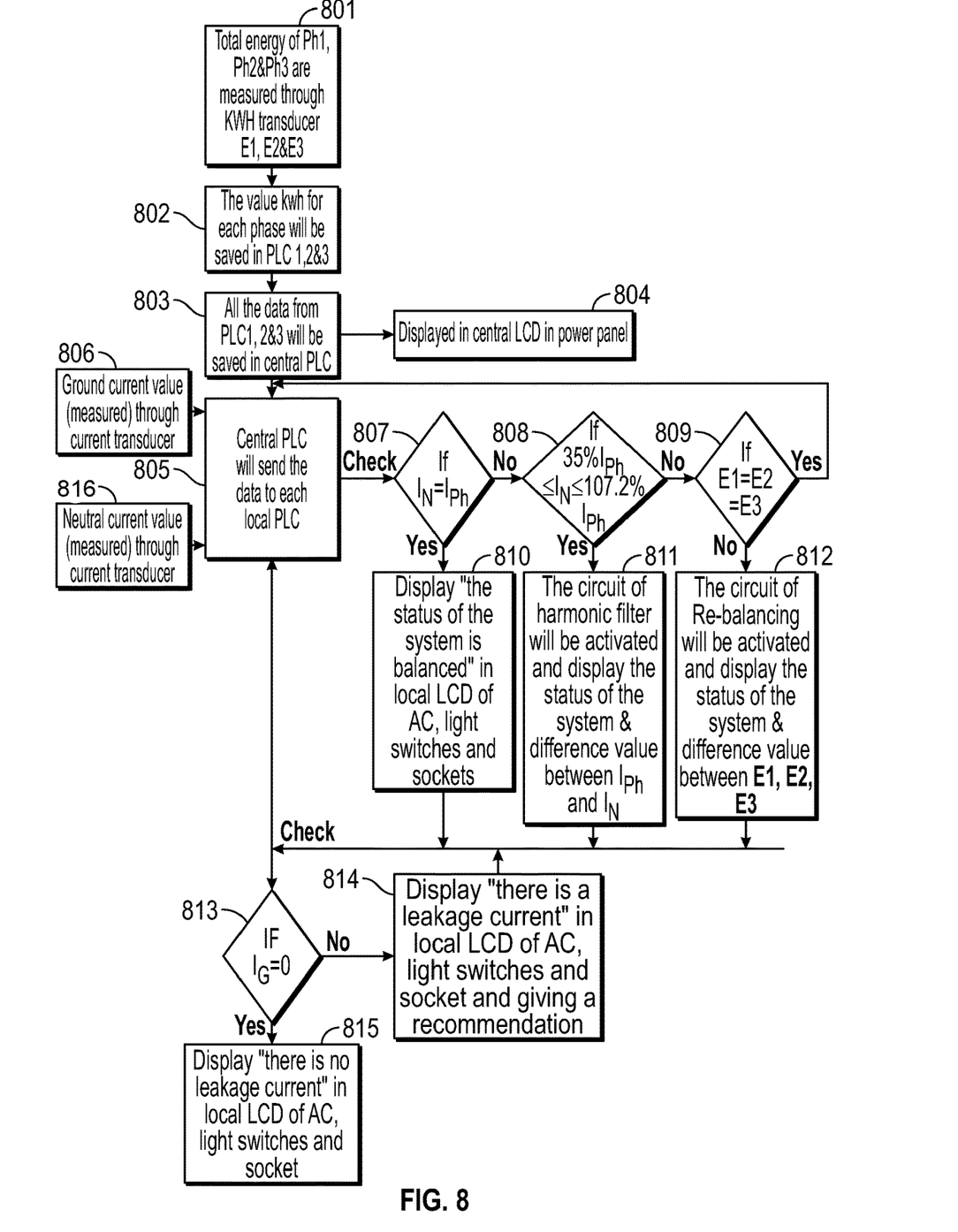
FIG. 8 shows a flowchart of communication between all elements within the system.

FIG. 8. shows a diagram of the entire system monitoring and controlling electrical energy. Specifically, in Block 801, the electrical energy is measured for each phase (101-103) by the TDRs (111-113). TDRs (111-113) measure the impedance between the local switch and the load itself. In Block 802, the data obtained by the TDRs (111-113) is stored to the local PLCs (121-123) assigned to each phase. This process operates in the real-time and the data about electrical energy of each phase is continuously updated and saved to the local PLCs (121-123).

Further, in Block 803 data obtained by the TDRs (111-113) and stored to the local PLCs (121-123) is continuously transferred and saved to the central PLC (130). The central PLC (130) processes and analyses the data and sends the results of the analysis to the smart touch display (160) that interacts with the user in Block 804.

In Block 805, the users requests and changes are transmitted to the local PLCs (121-123) which contain real-time data regarding the data about the electric energy in the each phase. Further, in Blocks 806 and 816, the local PLCs (121) receive the value of neutral and ground electrical currents that are measured by the current transmitter for each load.

Measuring data about the electrical current values of neutral (141) and ground bus bars (142) is obtained and transmitted to the local PLCs in the real-time.

Further, in Blocks 807-809 the data obtained by the TDRs is analyzed for any deviations. If deviations from the parameter's ranges assigned by the user exits, the system starts corrective processes. Specifically, in Block 807 the central PLC (130) monitors if the value of electrical current in each phase is equal to the electrical current of neutral current. If values of two currents are equal, the system is in balance, result is reported to the user over smart touch display in Block 810, and Blocks 808 and 809 are skipped. Otherwise, the system has to further investigate potential causes for the deviations.

In Block 808, the centra PLC (130) checks if the value of the neutral current is in range from 35% of the value of the phase current to 107.2% of the value of the phase current. If the value is in the above-mentioned range the system activates the circuit of harmonics, displays the status of the system and a difference value between the value of the phase current and the value of the phase current in Block 811, and skips Block 809.

Returning to FIG. 8, Block 809 checks if the values of electric energy in all phases are same. If deviations between values of the electric energy between phases are present, the system activates the circuit of rebalancing, displays the status of the system, values of electric energy in all phases, and sends relevant information about the process to the central PLC (130).

The rebalancing process or the process of redistributing the load functions calculating the total energy or total sum of all currents in the system. The total energy is divided by 3 to obtain the average current or average energy, which has a significant role in calculations. The average current or average energy will be represented as 100%, and each load will be expressed as a percentage based on its value related to avenge energy value or average current value.

Further, the loads are categorized into four levels. The first level contains currents with values in range from 0% to 25% of the average current or energy value. The second level contains currents with values in range from 25% to 50% of the average current or energy value. The third level contains currents with values in range from 50% to 75% of the average current or energy value. The fourth level contains currents with values in range from 75% to 100% of the average current or energy value.

In one or more embodiment, the load with the highest value is connected to the first phase (101), the load with the second highest value is connected to second phase (102) and the load with the third highest value is connected to the third phase (103). Further, the central PLC (130) calculates the percentage that makes the total energy or current in the first phase (101). The central PLC (130) starts looking for the ideal candidate from the highest level towards the lowest level. The ideal candidates are the ones that add up to the average value of electric energy or current in one phase. The system may add one or more loads to each phase, until the requirement is met. The objective of redistributing the loads is to have 100% of the average current or energy value in each phase or to be in a range of 5% to 15% from the ideal value.

Further, if a single load constitutes 100% of the average current or energy value, that load is the only one connected to one phase, as it meets all requirements. If the system has only one load, that load will be shifted from one load to another, in predetermined periods of time, to ensure that each phase is connected to a load, in a predetermined period of time. Also, if a new load is connected to the system, after the system already redistributed the loads between the phases, the new load will randomly be connected to a single phase. After a predetermined period of time, the system will compute the average energy and redistribute the loads again, including the new load.

Figure 9:
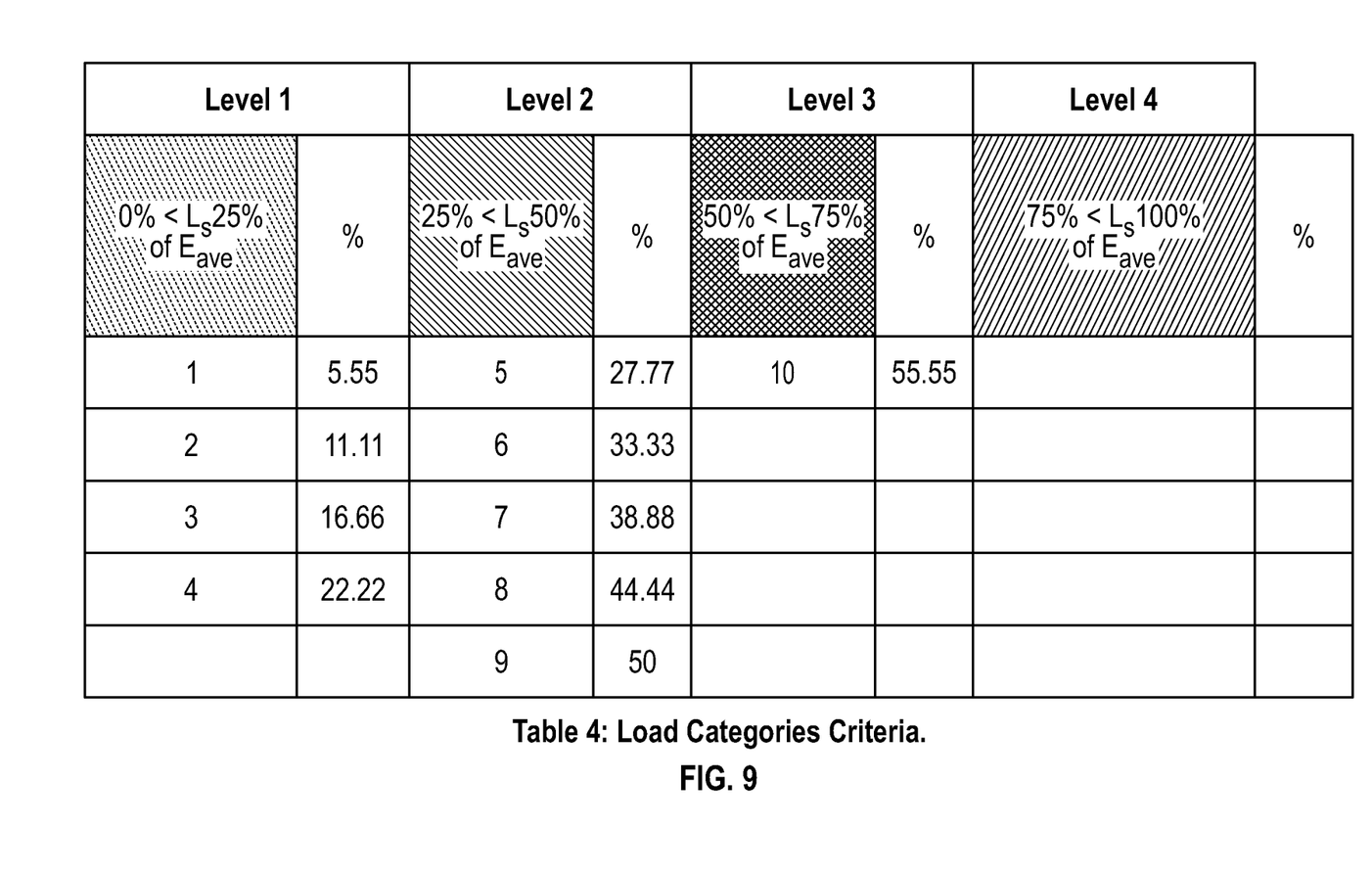
FIG. 9 shows an example of criteria for sorting the loads in the rebalancing process.
Figure 10:
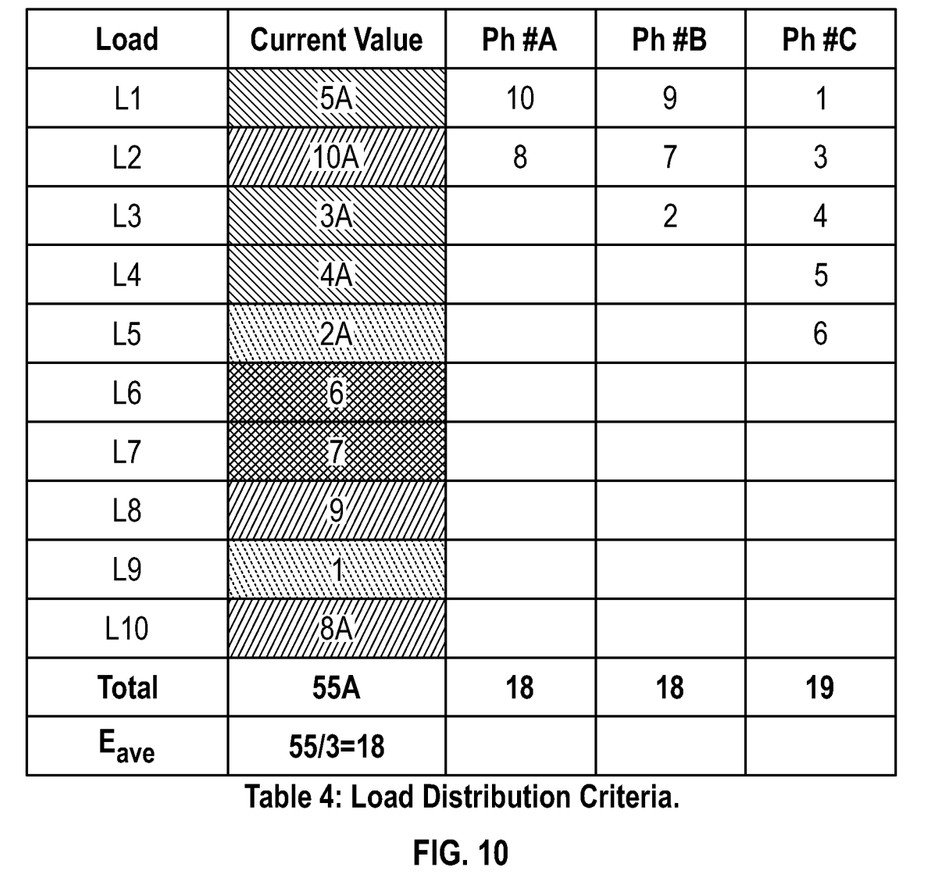
FIG. 10 shows an example of final distribution of the loads in the rebalancing process.

Between every computed new avenge energy, the system will start after a predetermined period of time as the time difference between any balancing operation to ensure that a new load is not a temporary load, such as opening and closing a garage. FIGS. 9 and 10 are examples that show how the balancing process is done.

Initially, as shown in FIG. 9 for the exemplary purposes, the system has 10 loads and their values are 1A, 2A, 3A, 4A, 5A, 6A, 7A, 8A, 9A, 10A. The system calculates the total current value, which is a sum of all current values and equals to 55A. The total current value is divided by 3 to calculate the average current value, that equals to 18A. Based on their percentage in the average current value, each load is assigned to its respective level. For example, 10A is 55.55% of 18A and therefore it belongs to level 3.

FIG. 10, shows the final load distribution wherein the highest load of 10A is connected to the first phase (101). Further, the system calculates if one additional load from the next or same level, meets all requirement when combined with the highest load. In this example, load 8A meets all requirements as loads 10A and 8A add up to the average current value. The system repeats this process for the rest of the loads until all requirements are met.

Returning to FIG. 8, Block 813 checks if the value of electric current in the ground bus (142) is equal to zero. If the value of electric current in the ground bus (142) is not equal to zero, in Block 814, the system displays a notification that there has been a leakage current and the system gives a recommendation to the user on possible ways to proceed. However, if the value of electric current in the ground bar (142) is equal to zero, the system, in Block 815, displays a notification that there is no leakage current and that a system is functioning properly.

Figure 11:
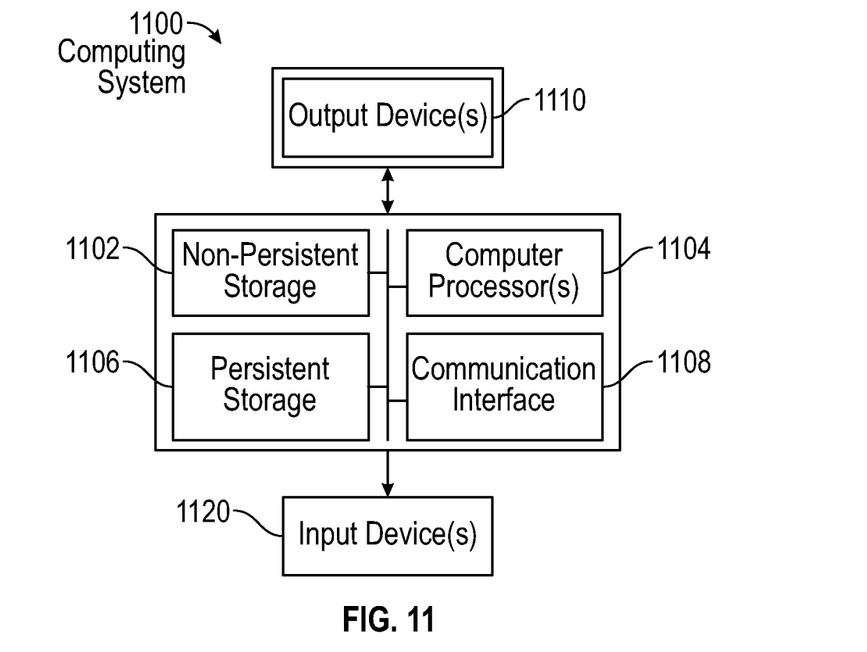
FIG. 11 shows a computer system in accordance with one or more embodiments.

Embodiments may be implemented on a computing system. Any combination of mobile, desktop, server, router, switch, embedded device, or other types of hardware may be used. For example, as shown in FIG. 11, the computing system (1100) may include one or more computer processors (1104), non-persistent storage (1102) (e.g., volatile memory, such as random access memory (RAM), cache memory), persistent storage (1106) (e.g., a hard disk, an optical drive such as a compact disk (CD) drive or digital versatile disk (DVD) drive, a flash memory, etc.), a communication interface (1108) (e.g., Bluetooth interface, infrared interface, network interface, optical interface, etc.), and numerous other elements and functionalities.

The computer processor(s) (1104) may be an integrated circuit for processing instructions. For example, the computer processor(s) may be one or more cores or micro-cores of a processor. The computing system (1100) may also include one or more input devices (1120), such as a touchscreen, keyboard, mouse, microphone, touchpad, electronic pen, or any other type of input device.

The communication interface (1108) may include an integrated circuit for connecting the computing system (1100) to a network (not shown) (e.g., a local area network (LAN), a wide area network (WAN) such as the Internet, mobile network, or any other type of network) and/or to another device, such as another computing device.

Further, the computing system (1100) may include one or more output devices (1110), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1104), non-persistent storage (1102), and persistent storage (1106). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

While the disclosure has been described with respect to a limited number of embodiments, those skilled in the art, having benefit of this disclosure, will appreciate that other embodiments may be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A system for controlling and monitoring electrical energy loads, the system comprising:
respective current transducers configured to monitor respective values of electrical current of three phases in the system, wherein a neutral line and a ground line are monitored via separate respective current transducers;
a centralized programmable logic controller (PLC) configured to receive the monitored values from the current transducers in real time;
a local PLC configured to receive the monitored values from the centralized PLC; and
a rebalancing circuit, activated by the local PLC, monitoring the electrical current in the current transducer of the neutral line and redistributing the electrical energy loads based on a balancing process,
wherein the local PLC periodically compares the monitored values of the electrical current with predetermined thresholds and automatically redistributes the electrical current to the electrical energy loads among three phases based on the comparison,
wherein the rebalancing circuit calculates an average electrical current by dividing a total electrical current of the three phases by 3 and categorizes each electrical energy load into four levels, based on a value of each electrical energy load relative to the average electrical current,
wherein the rebalancing circuit connects three electrical energy loads having highest electrical energy load values, starting from a highest level to a lowest level, to each of the three phases, respectively, and
wherein the rebalancing circuit adds repetitively, to each of the three phases starting from the highest level to the lowest level, the electrical energy loads, until each of the three phases reaches the average electrical current.

2. The system of claim 1, further comprising:
a harmonic treatment circuit, activated by the local PLC, monitoring the electrical current in the current transducer of the neutral line and activating harmonic filters after detecting harmonics;
a leakage current detection circuit, activated by the local PLC, monitoring the electrical current in the current transducer of the ground line based on Kirchhoff Current Law and observing leakage current supplied to the leakage current detection circuit; and
a smart touch display indicating a harmonic status, a balancing activity, a leakage current value, and a leakage location.

3. The system of claim 2, wherein the harmonic filters comprise C-type filters, wherein a capacitor is placed in a series with a combination of a resistor connected in parallel to a series-connected second capacitor and inductor.

4. The system of claim 3, wherein the C-type harmonic filter is connected to a local PLC output removing the harmonics from the system.

5. The system of claim 2, wherein the local PLC alarms a user for the leakage current and indicates the leakage location.

6. The system of claim 2, wherein the local PLC receives the monitored values of the electrical current from the centralized PLC and compares the monitored values of the electrical current with setting parameters for an unbalanced electrical energy load, the harmonics, and the leakage current.

7. The system of claim 6, wherein the local PLC performs, based on a comparison, an automatic redistribution of the electrical energy loads among the three phases based on the received electrical current values until the electrical current is equal to the average electrical current in the three phases.

8. The system of claim 1, wherein the centralized PLC receives real time data and organizes the real time data for further analysis.

9. The system of claim 1, wherein a Time-domain reflectometer (TDR) is connected to the local PLC measuring an impedance of a phase line between a local switch and the electrical energy load.

10. The system of claim 1, wherein the local PLC receives the electrical current values from the respective current transducers of the three phases of the system and sends them to the centralized PLC.

11. A method for controlling and monitoring electrical energy loads, the method comprising:
monitoring respective values of electrical current of three phases, using respective current transducers, in a system, wherein a neutral and a ground line are monitored via separate respective current transducers;

receiving monitored values, using a centralized programmable logic controller (PLC), from the current transducers in real time;

receiving the monitored values, using a local PLC, from the centralized PLC; and monitoring the electrical current in the current transducer of the neutral line and redistributing the electrical energy loads based on a balancing process, wherein the local PLC periodically compares the monitored values of the electrical current with predetermined thresholds and automatically redistributes the electrical current to the electrical energy loads among three phases based on the comparison, and wherein the balancing process comprises:
- calculating an average electrical current by dividing a total electrical current of the three phases by 3 and categorizing each electrical energy load into four levels, based on a value of each electrical energy load relative to the average electrical current,
- connecting three electrical energy loads having highest electrical energy load values, starting from a highest level to a lowest level, to each of the three phases, respectively, and
- adding repetitively, to each of the three phases starting from the highest level to the lowest level, the electrical energy loads, until each of the three phases reaches the average electrical current.

12. The method of claim 11, further comprising:

monitoring the electrical current in the current transducer of the neutral line and activating harmonic filters after detecting harmonics;

monitoring the electrical current in the current transducer of the ground line based on Kirchhoff Current Law to observe leakage current supplied to the system; and displaying a harmonic status, a balancing activity, a leakage current value, and a leakage location.

13. The method of claim 12, wherein the harmonic filters comprise C-type filters, wherein a capacitor is placed in a series with a combination of a resistor connected in parallel to a series-connected second capacitor and inductor.

14. The method of claim 13, wherein the C-type harmonic filters are connected to a local PLC output removing the harmonics from the system.

15. The method of claim 12, wherein the local PLC receives the values of the electrical current from the centralized PLC and compares the received values of the electrical current with setting parameters for an unbalanced electrical energy load, the harmonics, and the leakage current.

16. The method of claim 11, wherein when one of the electrical energy loads has a value that is equal or greater than the average electrical current, the one electrical energy load will be the only electrical energy load connected to one of the three phases.

17. The method of claim 16, wherein the one electrical energy load, that has a value that is equal or greater than the average electrical current, periodically shifts phases.

18. The method of claim 11, wherein when the electrical energy loads are connected to the system, the electrical energy loads are randomly connected to the three phases and an automatic redistribution process is activated.

19. The method of claim 11, wherein the local PLC performs, based on a comparison, the automatic redistribution of the electrical energy loads among the three phases based on the received electrical current values until the electrical current is equal in the three phases.

* * * * *